(12) United States Patent
Okagawa

(10) Patent No.: US 8,716,770 B2
(45) Date of Patent: May 6, 2014

(54) SOLID-STATE IMAGING APPARATUS THAT INCLUDES A LOCAL INTERCONNECT AND METHOD FOR MANUFACTURING THE SAME

(75) Inventor: Takashi Okagawa, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 269 days.

(21) Appl. No.: 12/776,065

(22) Filed: May 7, 2010

(65) Prior Publication Data

US 2010/0320517 A1   Dec. 23, 2010

(30) Foreign Application Priority Data

Jun. 18, 2009   (JP) .................................. 2009-145698

(51) Int. Cl.
*H01L 23/528* (2006.01)
*H01L 31/05* (2006.01)

(52) U.S. Cl.
USPC .................... 257/292; 257/291; 257/E23.151; 257/294

(58) Field of Classification Search
CPC .................... H01L 21/76895; H01L 21/14636
USPC .................... 257/291–294, 59, 72, E21.575
See application file for complete search history.

(56) References Cited

U.S. PATENT DOCUMENTS

| | | | |
|---|---|---|---|
| 7,749,788 B2 | 7/2010 | Okagawa et al. | 438/48 |
| 7,935,995 B2 | 5/2011 | Watanabe et al. | 257/292 |
| 8,222,682 B2 | 7/2012 | Watanabe et al. | 257/292 |
| 2006/0043440 A1 | 3/2006 | Hiyama et al. | 257/291 |
| 2006/0125007 A1* | 6/2006 | Rhodes | 257/346 |
| 2006/0157761 A1* | 7/2006 | Park et al. | 257/293 |
| 2007/0120214 A1* | 5/2007 | Cole | 257/461 |
| 2007/0281382 A1* | 12/2007 | Watanabe | 438/57 |
| 2008/0029787 A1* | 2/2008 | Watanabe et al. | 257/233 |
| 2008/0203450 A1 | 8/2008 | Naruse et al. | 257/290 |
| 2008/0258250 A1* | 10/2008 | Uenishi | 257/432 |
| 2009/0302323 A1* | 12/2009 | Yin et al. | 257/72 |
| 2010/0283088 A1* | 11/2010 | Lee et al. | 257/254 |

FOREIGN PATENT DOCUMENTS

| | | |
|---|---|---|
| JP | 2002-368203 A | 12/2002 |
| JP | 2003-197889 A | 7/2003 |
| JP | 2006-073733 A | 3/2006 |
| JP | 2008-041689 A | 2/2008 |

OTHER PUBLICATIONS

Office Action issued by the Japanese Patent Office on Sep. 17, 2013, in counterpart Japanese Appl'n. No. 2009-145698 (with partial English language translation).

* cited by examiner

*Primary Examiner* — Fernando L Toledo
*Assistant Examiner* — Peter Bradford
(74) *Attorney, Agent, or Firm* — Fitzpatrick, Cella, Harper & Scinto

(57) ABSTRACT

A solid-state imaging apparatus comprises: a plurality of photoelectric conversion elements for converting light into an electric charge, including a first photoelectric conversion element; a first semiconductor region from which the electric charge is transferred from a first photoelectric conversion element; an amplifying MOS transistor including a gate electrode connected to the first semiconductor region to amplify the potential of the first semiconductor region; an insulating film; a metal wiring layer above the insulating film; a local interconnect of a first conductor, formed in the insulating film, for connecting the gate electrode of the amplifying MOS transistor to the first semiconductor region not through the metal wiring layer; a second semiconductor region, different from the first semiconductor region; and a second conductor for connecting the second semiconductor region to at least a part of the metal wiring layer.

8 Claims, 3 Drawing Sheets

- METAL WIRING
- GATE ELECTRODE
- DIFFUSION REGION
- CONTACT HOLE

SOLID-STATE IMAGING APPARATUS THAT INCLUDES A LOCAL INTERCONNECT AND METHOD FOR MANUFACTURING THE SAME

BACKGROUND OF THE INVENTION

1. Field of the Invention

The present invention relates to a solid-state imaging apparatus and a method for manufacturing the same.

2. Description of the Related Art

In recent years, inexpensive digital camera and video camera of high quality are wide-spread due to the progress of a solid-state imaging apparatus. In particular, a CMOS-type solid-state imaging apparatus which has an active element in a pixel and can convert a peripheral circuit to an on-chip type has been remarkably improving its performance, and is partially being substituted for a CCD sensor. The CMOS-type solid-state imaging apparatus has MOS transistors and photodiodes in a pixel region, and the peripheral circuit unit is constituted by the MOS transistors. A low cost which is one of advantages of the CMOS-type solid-state imaging apparatus can be achieved by commonizing a process of manufacturing the MOS transistors in the pixel unit and a process of manufacturing the MOS transistors in the peripheral circuit unit.

In addition, the solid-state imaging apparatus is being multi-pixelated, and thereby the pixel pitch is reduced. Accordingly, it becomes essential to refine the photodiodes, the transistors and the wiring.

Japanese Patent Application Laid-Open No. 2006-073733 discloses a CMOS-type solid-state imaging apparatus having a configuration in which a semiconductor region and a gate electrode are connected through metal wiring. Japanese Patent Application Laid-Open No. 2002-368203 discloses a CCD-type solid-state imaging apparatus that has a configuration in which an output transistor and a floating diffusion are connected through a shared contact so as to enhance a coefficient of electric charge conversion by reducing the capacitance.

In the CMOS-type solid-state imaging apparatus, a light coming from an image passes through a wiring layer and is incident on the solid-state imaging apparatus, but all lights are not vertically incident thereon. Incident angles of the lights which are incident from an optical system vary according to the F value of an optical lens and the position on the solid-state imaging apparatus.

As the pixel pitch becomes more refined, a space between adjacent pixels becomes narrower, which cause a problem of a crosstalk that an incident light leaks into an adjacent pixel.

Furthermore, in a solid-state imaging apparatus which reproduces a color of the image with a color filter having a Bayer array or the like, the light which has leaked to the adjacent pixel is converted to a signal of another color, and accordingly causes a deterioration of image quality, which is referred to as a color mixture. In the above description, the crosstalk can be reduced by setting a sufficient space between the pixels, but then, the pixel becomes difficult to be refined.

An object of the present invention is to provide a solid-state imaging apparatus which can achieve the refinement of the pixel by improving optical properties such as the crosstalk of the light among the pixels and a method for manufacturing the same.

Another object of the present invention is to provide a method of manufacturing a solid-state imaging apparatus, which can reduce the pollution of metal, which can occur when a structure of being capable of refining the pixel is manufactured, by enhancing optical properties such as the crosstalk of the light among the pixels.

SUMMARY OF THE INVENTION

According to the present invention, a method of manufacturing a solid-state imaging apparatus comprises: a plurality of photoelectric conversion elements arranged on a semiconductor substrate to convert light into an electric charge, and having a first photoelectric conversion element; a first semiconductor region arranged on the semiconductor substrate, wherein the electric charge is transferred from the first photoelectric conversion element to the first semiconductor region; an amplifying MOS transistor arranged on the semiconductor substrate, wherein the amplifying MOS transistor has a gate electrode connected to the first semiconductor region to amplify the potential of the first semiconductor region; an insulating film on the semiconductor substrate; a metal wiring layer arranged above the insulating film; a local interconnect of a first conductor for connecting the gate electrode of the amplifying MOS transistor to the first semiconductor region not through the metal wiring layer; a second semiconductor region arranged on the semiconductor substrate, wherein the second semiconductor region is different from the first semiconductor region; and a second conductor for connecting the second semiconductor region to at least a part of the metal wiring layer, wherein the method comprises: a local interconnect groove forming step for forming the local interconnect groove in the insulating film; a contact hole forming step for forming the contact hole in the insulating film; a first conductor forming step for forming the first conductor in the local interconnect groove; and a second conductor forming step for forming the second conductor in the contact hole, wherein the first conductor forming step and the second conductor forming step are performed simultaneously.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

Figure 4:
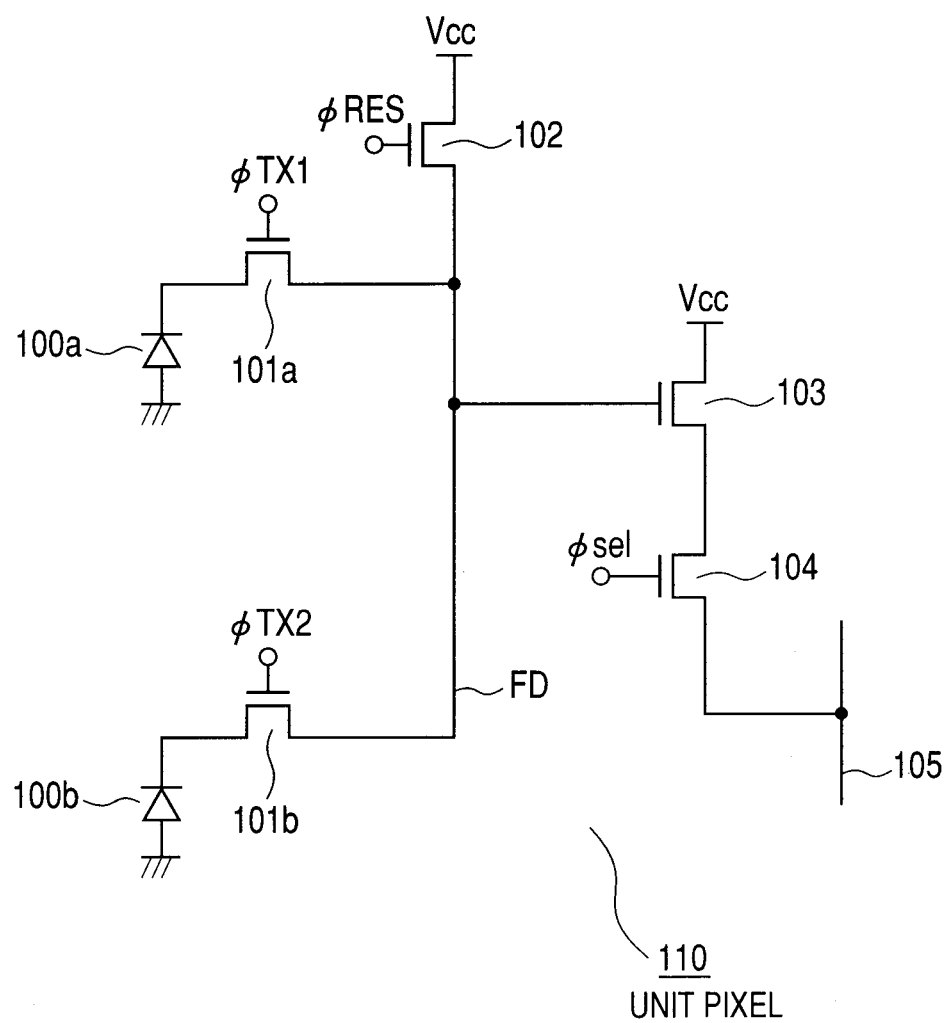
FIG. 4 is a circuit diagram of the solid-state imaging apparatus.

FIG. 4 illustrates one example of a circuit configuration of a unit pixel 110 of a CMOS-type solid-state imaging apparatus according to an embodiment of the present invention. The unit pixel 110 includes photodiodes 100a and 100b which are photoelectric conversion elements, transfer transistors 101a and 101b, a reset transistor 102, an amplification transistor 103 and a select transistor 104. The pixel unit of the solid-state imaging apparatus is constituted by a plurality of arrayed unit pixels 110. Here, a power source line is denoted by Vcc, and an output line is denoted by 105.

As for the photodiodes 100a and 100b, the anodes thereof are connected to a ground line, and the respective cathodes are connected to sources of the transfer transistors 101a and 101b. In addition, the sources of the transfer transistors 101a and 101b can also serve as the cathodes of the photodiodes 100a and 100b.

Each drain of the transfer transistors 101a and 101b is connected to the gate electrode of the amplification transistor 103. The floating diffusion FD is constituted by the each drain of the transfer transistors 101a and 101b and the gate electrode of the amplification transistor 103. The gate electrodes of the transfer transistors 101a and 101b are connected to transfer signal lines (not-shown), and pulses φTX1 and φTX2 are supplied to the gate electrodes, respectively. The reset transistor 102 makes its drain connected to the power source line Vcc and its source connected to the floating diffusion FD. The gate electrode of the reset transistor 102 is connected to a reset signal line, and a pulse φRES is supplied to the gate electrode. The amplification transistor 103 makes its drain connected to the power source line Vcc and its source connected to the drain of the select transistor 104. The select transistor 104 makes its source connected to the output line 105 and its gate connected to a selection line which is driven by a vertical selecting circuit (not-shown), and a pulse φSel is supplied to the gate.

The circuit configuration illustrated here can be applied to all embodiments of the present invention. The circuit configuration may be, for instance, a configuration in which the unit pixel 110 has no transfer transistors 101a and 101b, a configuration in which the unit pixel 110 has no select transistor 104, and a configuration in which the unit pixel 110 contains three or more photoelectric conversion elements 100a and 100b.

Figure 1:
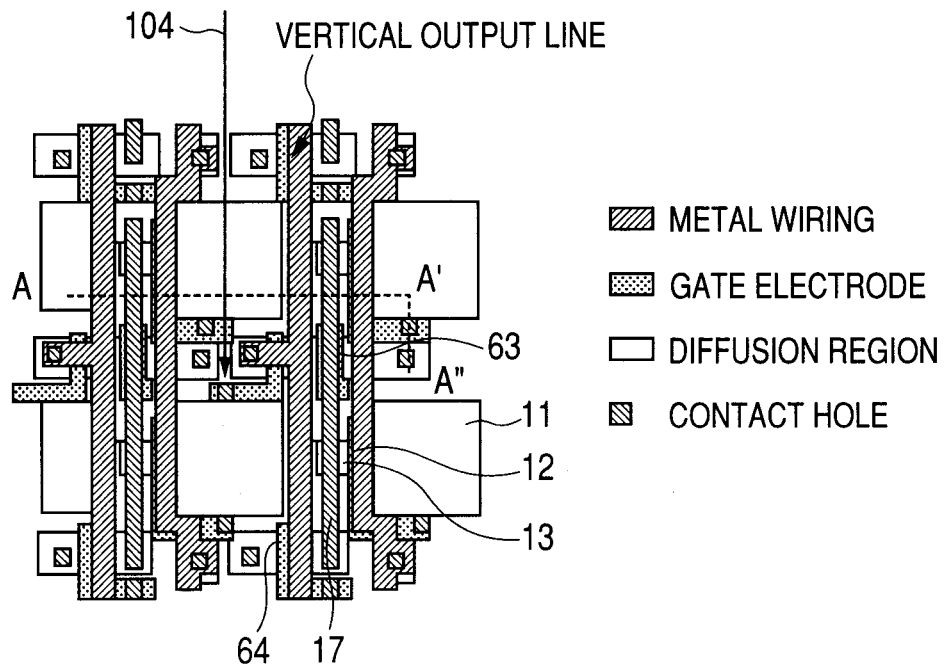
FIG. 1 is a plan view of a solid-state imaging apparatus according to an embodiment of the present invention.
Figure 2:
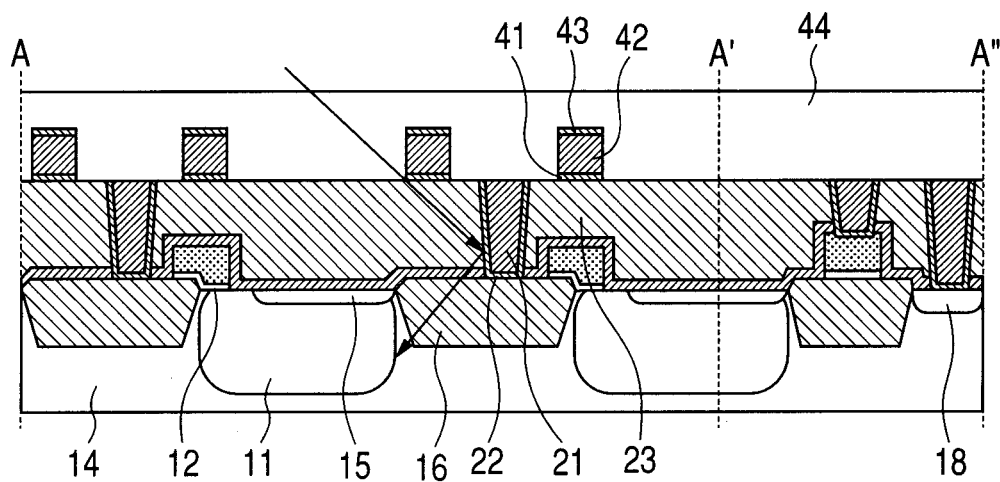
FIG. 2 is a sectional structure view of the solid-state imaging apparatus according to the embodiment of the present invention.

FIG. 1 illustrates a planar structure of a pixel unit of a solid-state imaging apparatus according to an embodiment of the present invention, and the structure corresponds to that of FIG. 4. FIG. 2 illustrates a sectional structure taken along the line A-A'-A" of FIG. 1.

The relationship between FIG. 1 and FIG. 4 will now be described below. An accumulation region 11 of a photodiode corresponds to the photoelectric conversion elements (photodiode) 100a and 100b of FIG. 4. A transfer gate 12 corresponds to the transfer transistors 101a and 101b of FIG. 4. A voltage conversion part (first semiconductor region) 13 corresponds to the floating diffusion FD of FIG. 4. An amplifying MOS transistor 63 corresponds to the amplification transistor 103 of FIG. 4. A reset MOS transistor 64 corresponds to the reset transistor 102 of FIG. 4. A local interconnect 17 is shown in FIG. 1. The photoelectrical charge which has been accumulated in the accumulation region 11 of the photodiode is converted into a voltage signal by the voltage conversion part 13 according to a switching on or off operation of the transfer gate 12. The voltage signal is amplified by the amplifying MOS transistor 63 of which the gate electrode is connected to the local interconnect 17, and is read by a readout circuit constituted by MOS transistors configured in the peripheral circuit region, out to the outside of the imaging apparatus. In FIG. 1, two voltage conversion parts 13, the gate electrode of the amplifying MOS transistor 63 and the source of the reset transistor 64 are arranged on a straight line, and the local interconnect 17 lies/extends on the upper part. The local interconnect 17 electrically connects the two voltage conversion parts 13, the gate electrode of the amplifying MOS transistor 63, and the source of the reset transistor 64. In FIG. 1, the local interconnect 17 is arranged between the unit pixels, which can inhibit a light incident on a unit pixel from leaking to the adjacent unit pixel. In other words, the local interconnect 17 has a light shielding function.

Next, a configuration of FIG. 2 will be described below. The accumulation region 11 of a photodiode formed from a first electroconductive-type semiconductor is formed in a well (semiconductor substrate) 14 formed from a second electroconductive-type semiconductor. A surface of the photodiode is covered with a surface layer 15 formed of the second electroconductive-type semiconductor region. A transfer gate 12, an element isolation region 16, a source region or drain region 18 of an MOS transistor in a pixel (second semiconductor region), an interlayer insulating film 23 and a second interlayer insulating film 44 are shown. An embedded metal plug 21 (first conductor) and a metal diffusion suppressing layer 22 constitute the local interconnect 17. A lower metal-diffusion suppressing layer 41, metal wiring 42 and an upper metal-diffusion suppressing layer 43 constitute metal wiring.

Here, the local interconnect 17 is LIC (Local Inter Connect). In the present embodiment, the local interconnect 17 lies/extends between a plurality of the voltage conversion parts 13 and the gate electrode 63, and connects the plurality of the voltage conversion parts 13 to the gate electrode 63 of the amplifying MOS transistor without connecting through a metal wiring layer (FIG. 1). The local interconnect 17 is formed simultaneously with a contact hole, and accordingly is directly connected to the voltage conversion parts 13, and the gate electrode of the amplifying MOS transistor 63. In the present embodiment, the local interconnect means a member which is a combination of a plug and a wire for connecting the semiconductor regions to the gate electrode. The local interconnect is also the wiring which is provided in each pixel or in a unit pixel 110. The source region or the drain region 18 of the MOS transistor in the pixel is connected to the metal wiring 42 by a plug to be arranged in the contact hole 25 (FIGS. 3A to 3C).

A manufacturing flow according to the present embodiment will be described below with reference to FIGS. 3A to 3C which is a sectional view of a manufacturing process in the same position as FIG. 2.

Figure 3A:
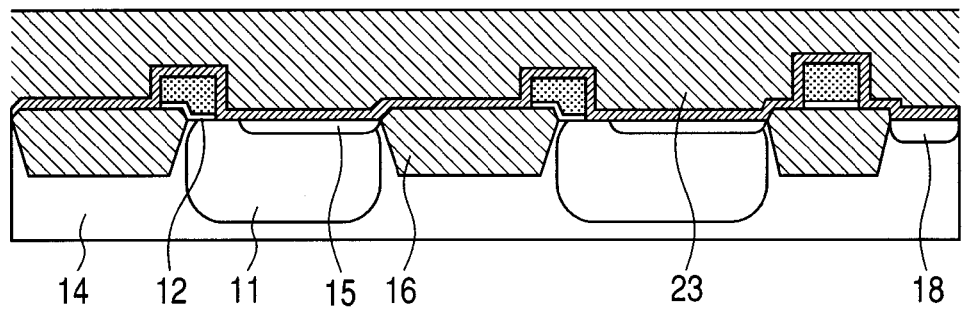
FIGS. 3A, 3B and 3C are sectional structure views of a process for manufacturing the solid-state imaging apparatus according to the embodiment of the present invention.

In FIG. 3A, an element isolation region 16, an accumulation region 11 of a photodiode, a voltage conversion part 13, a source region or a drain region 18 of an MOS transistor in a pixel and a surface layer 15 are formed in a well 14 formed from a second electroconductive-type semiconductor. A transfer gate 12, and the gate electrode wiring of the transfer gate and the like, which is made from the same material as that of the transfer gate, are formed thereon, and a first interlayer insulating film 23 is formed. The accumulation region 11 of the photodiode is formed from the first electroconductive-type semiconductor. The surface layer 15 is formed from the second electroconductive-type semiconductor region.

Figure 3B:
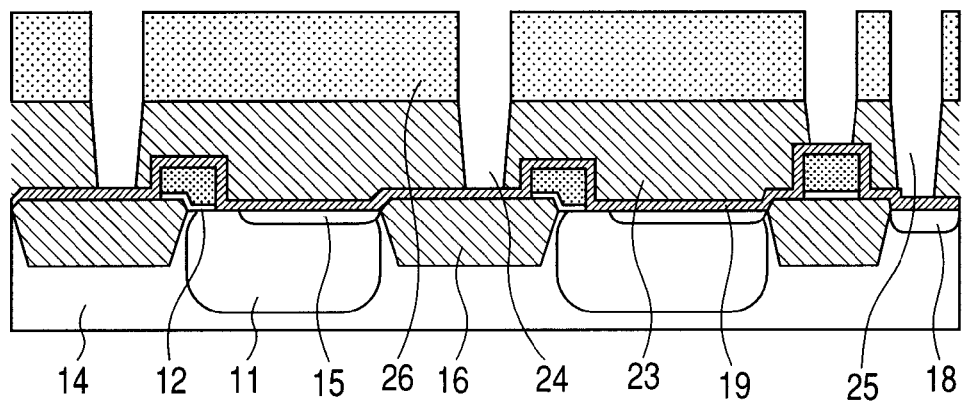
Figure 3C:
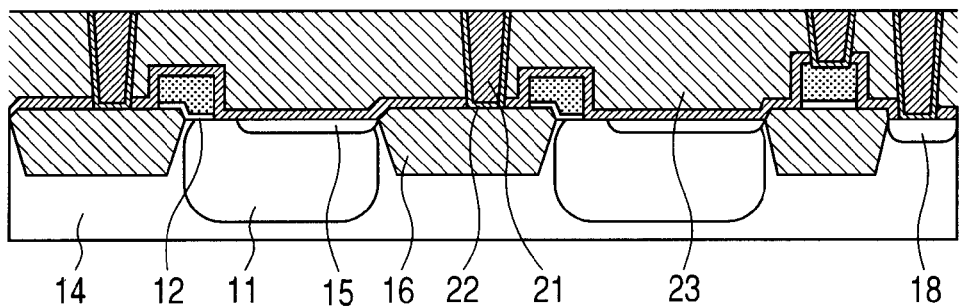

Next, in FIG. 3B, a photoresist 26 is formed on the interlayer insulating film 23 and is patterned, and a local interconnect groove 24 and a contact hole 25 are opened down to the upper part of an etching stopper film 19 while the resist pattern is used as a mask. The etching stopper film 19 is formed before the first interlayer insulating film 23 is formed, and is made from a material different from that of the first interlayer insulating film 23.

Next, in FIG. 3C, the etching stopper film 19 in the parts of the local interconnect groove 24 and the contact hole 25 are opened, the photoresist 26 is removed, and then films of a metal diffusion suppressing layer 22 and the embedded metal film are formed thereon. An embedded metal plug 21 is formed through an etching or CMP process. The solid-state imaging apparatus has the etching stopper film 19 formed therein, and accordingly can reduce the damage to the semiconductor substrate in the etching process.

Here, the films of the metal diffusion suppressing layer 22 and the embedded metal film are desirably formed in the local interconnect groove 24 and the contact hole 25 simultaneously. If the local interconnect groove 24 is previously formed thereon, the metal diffusion suppressing layer 22 and the embedded metal film are formed thereon to form the local interconnect and then the contact hole 25 is formed, the semiconductor substrate results in being exposed to an atmosphere after the metal film has been formed. At this time, the metal may be mixed into the semiconductor substrate in an etching process for forming the contact hole or the like. The pollution of the metal into the semiconductor substrate forms a defect in the semiconductor substrate, and results in causing a leak electric current and the like. The manufacturing method according to the present embodiment forms the metal film after all steps for opening the surface of the semiconductor substrate have been finished, and accordingly can reduce the pollution of the metal into the semiconductor substrate. However, all the steps of opening an insulating film and exposing the semiconductor substrate may not be performed simultaneously. The step of forming the metal film may be performed after all the steps of exposing the surface of the semiconductor substrate.

After this, a film to be a lower metal-diffusion suppressing layer 41, a film to be the metal wiring 42 and a film to be an upper metal-diffusion suppressing layer 43 are formed, and the metal wiring is formed through the patterning of a photoresist, the etching of the films and the removal of the resist. Next, a second interlayer insulating film 44 is formed thereon, and as a result, a structure of FIG. 2 is obtained.

The feature of the present embodiment is that the local interconnect 17 is used for the connection of the voltage conversion parts 13 with the gate electrode of the amplifying MOS transistor 64, though generally, the metal wiring is used. Therefore, the solid-state imaging apparatus can shield a obliquely incident light, and accordingly can decrease the crosstalk of the light to the adjacent pixel.

FIG. 1 and FIG. 2 will be described further in detail below. When the local interconnect 17 is used, the semiconductor region can be directly connected to the gate electrode not through the metal wiring 42. In addition, the local interconnect 17 can shield the obliquely incident light by being continuously arranged between the adjacent pixels. The state is shown by the arrow of FIG. 2. The arrow in FIG. 2 shows an optical path of a component of a obliquely incident light among lights which have been incident on the pixel. Local connection wiring 21 reflects the light, and thereby decreases the crosstalk of the light to the adjacent pixel. The reflected light is taken in a photoelectric conversion element (photodiode) 11, and is used as an electric signal charge to enhance the sensitivity.

Furthermore, the embodiment illustrated in FIG. 1 has a circuit configuration in which the amplifying MOS transistor 64, the reset MOS transistor 63 and the like are shared by a plurality of pixels. Accordingly, the local interconnect 17 partitions the plurality of the sharing pixels as a unit. One reset MOS transistor 63 is also necessary in the unit of the plurality of the pixels. As in FIG. 1, the reset MOS transistor 63 is arranged at the partition of the local interconnect 17, and thereby, the local interconnect 17 can partition the plurality of the pixel units at a position distant from any photoelectric conversion elements in the pixels. As a result, such a layout is enabled as to increase the area of the accumulation region 11 of the photodiode and decrease the crosstalk of the light.

It goes without saying that the above described embodiment shows the same effect even when the layout does not include, for instance, a select MOS transistor 104 and the like. An etching stopper film 19 also may not be provided.

The solid-state imaging apparatus according to the present embodiment can be used for a digital camera, a digital video camera and the like.

The solid-state imaging apparatus according to the present embodiment can optically separate pixels from each other without adding an unnecessary pattern, and accordingly can improve the crosstalk and refine the pixel simultaneously. The solid-state imaging apparatus which causes little crosstalk of the light to the adjacent pixel and forms an image of high quality can be manufactured by employing a structure with the use of the local interconnect 17.

In the solid-state imaging apparatus according to the present embodiment, a plurality of photoelectric conversion elements 100a, 100b and 11 are arranged in a semiconductor substrate (well) 14, and convert the light into an electric charge. The first semiconductor region (voltage conversion part) 13 and FD are arranged in the semiconductor substrate 14, and convert the electric charge which has been changed by the photoelectric conversion elements 100a, 100b and 11 into voltage. The amplifying MOS transistor 63 and 103 is arranged in the semiconductor substrate 14, has a gate electrode which is connected to the first semiconductor region 13 and FD, and amplifies the voltage which has been converted by the first semiconductor region 13 and FD. An insulating film (first interlayer insulating film) 23 covers the semiconductor substrate 14. A metal wiring layer (metal wiring) 42 is arranged on the insulating film 23. The first conductor (embedded metal plug) 21 and 17 in the local interconnect groove 24 is arranged in the insulating film 23, and connects the first semiconductor region 13 and FD to the gate electrode of the amplifying MOS transistor 63 and 103 not through the metal wiring layer 42. The second semiconductor region (source region or drain region of MOS transistor in pixel) 18 is arranged in the semiconductor substrate 14, and forms a different semiconductor region from the first semiconductor region 13 and FD. The second conductor (embedded metal plug) 21 in the contact hole 25 is arranged in the insulating film 23, and connects the second semiconductor region 18 with at least one part of the metal wiring layer 42.

The first conductor 21 and 17 in the local interconnect groove 24 is arranged between a plurality of the photoelectric conversion elements 100a, 100b and 11.

In addition, in the method for manufacturing the solid-state imaging apparatus according to the present embodiment, a step of forming the local interconnect groove forms the local interconnect groove 24 in the insulating film 23. A step of forming the contact hole forms the contact hole 25 in the insulating film 23. A step of forming the first conductor forms the first conductor 21 in the local interconnect groove 24. A step of forming the second conductor forms the second conductor 21 in the contact hole 25. The step of forming the first conductor and the step of forming the second conductor are simultaneously performed in the same step in FIG. 3C.

The step of forming the local interconnect groove and the step of forming the contact hole are also simultaneously performed in the same step in FIG. 3B.

A step of forming an etching stopper film forms the etching stopper film 19 for use in forming the local interconnect groove 24 and the contact hole 25 under the insulating film 23 by etching.

The first conductor 21 and 17 in the local interconnect groove 24 and the second conductor 21 in the contact hole 25 are formed mainly from a high melting point metal material or a high melting point silicide material.

In addition, the first conductor 21 and 17 in the local interconnect groove 24 and the second conductor 21 in the contact hole 25 are covered with a high melting point metal diffusion-prevention layer.

The solid-state imaging apparatus has also a reset MOS transistor 64 and 102 which is arranged in the semiconductor substrate 14 and initializes the electric charge of the first semiconductor region 13 and FD. A connection step connects the source region or the drain region of the reset MOS transistor 64 and 102 to the first conductor 21 and 17 in the local interconnect groove 24. That is, the local interconnect connects a source region or a drain region of the reset MOS transistor.

The above described step of forming the first conductor forms the first conductor 21 and 17 in the local interconnect groove 24 between a plurality of the photoelectric conversion elements 100a, 100b and 11.

As described above, the first conductor 21 and 17 in the local interconnect groove 24 is arranged between a plurality of the adjacent photoelectric conversion elements 100a, 100b and 11 as is illustrated in FIG. 2, and thereby can shield a obliquely incident light. The obliquely incident light is reflected by the first conductor 21 and in the local interconnect groove 24, which can reduce the crosstalk of the light to the adjacent photoelectric conversion elements 100a, 100b and 11. The reflected light is taken in the photoelectric conversion elements 100a, 100b and 11, and is used as a signal charge, which enhances the sensitivity.

Thereby, optical properties such as the crosstalk of the light in the pixels are enhanced, and the pixels can be thereby refined. In addition, the local interconnect and the contact hole are simultaneously formed, and the pollution of metal occurring when a structure in which the pixels are refined is manufactured can be thereby reduced.

In addition, all of the above described embodiments merely show examples for embodiment, and the scope of the present invention should not be definitely interpreted by the embodiments. In other words, the present invention can be conducted in various forms as long as the form does not depart from the technological thought or the principal feature of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-145698, filed Jun. 18, 2009, which is hereby incorporated by reference herein in its entirety.

What is claimed is:

1. A solid-state imaging apparatus comprising:
    a plurality of photoelectric conversion elements arranged in a semiconductor substrate to convert light into an electric charge, and which includes a first photoelectric conversion element and a second photoelectric element;
    a first semiconductor region, wherein electric charge is transferred from the first photoelectric conversion element to the first semiconductor region;
    a second semiconductor region, wherein electric charge is transferred from the second photoelectric conversion element to the second semiconductor region;
    an amplifying MOS transistor, wherein the amplifying MOS transistor has a common gate electrode electrically connected to the first and second semiconductor regions to amplify potentials of the first and second semiconductor regions wherein the amplifying MOS transistor is arranged between the first semiconductor region and the second semiconductor region, and wherein the first semiconductor region, the second semiconductor region, and the gate electrode of the amplifying MOS transistor are arranged in a straight line;
    a reset MOS transistor, wherein the reset MOS transistor has a third semiconductor region;
    a fourth semiconductor region, wherein the fourth semiconductor region is different from the first semiconductor region, the second semiconductor region, and the third semiconductor region;
    metal wiring layers arranged above the semiconductor substrate, and including a lowest metal wiring layer;
    interlayer insulating films arranged above the semiconductor substrate, and including a first interlayer insulating film, wherein the first interlayer film is arranged between the lowest metal wiring layer and the semiconductor substrate, and is arranged above the plurality of photoelectric conversion elements, the first semiconductor region, the second semiconductor region, the third semiconductor region, the fourth semiconductor region, and the amplifying MOS transistor; and
    a local interconnect of a first conductor electrically connecting the gate electrode of the amplifying MOS transistor and the first semiconductor region, wherein the local interconnect is within the first interlayer insulating film;
    wherein the local interconnect extends, along the straight line, from a position above the first semiconductor region to a position above the third semiconductor region across a position above the gate electrode of the amplifying MOS transistor and a position above the second semiconductor region,
    wherein the local interconnect forms a connection between the first semiconductor region, the gate electrode of the amplifying MOS transistor, the second semiconductor region and the third semiconductor region, and
    wherein a contact plug directly connecting the fourth semiconductor region, and connecting to at least a part of the lowest metal wiring layer, wherein the contact plug is within the first interlayer insulating film.

2. The solid-state imaging apparatus according to claim 1, wherein
    the local interconnect is arranged between the first photoelectric conversion element and another photoelectric conversion element of the plurality of photoelectric conversion elements.

3. The solid-state imaging apparatus according to claim 1, wherein the local interconnect has a light shielding function.

4. The solid-state imaging apparatus according to claim 1, further comprising an etching stopper film under the first interlayer insulating film.

5. The solid-state imaging apparatus according to claim 1, further comprising another local interconnect and another reset transistor, wherein the another reset transistor is arranged between the local interconnect and the other local interconnect.

6. The solid-state imaging apparatus according to claim 1, wherein a top face of the first conductor and a top face of the second conductor are a same height.

7. The solid-state imaging apparatus according to claim 1, wherein
the interlayer insulating films include a second interlayer insulating film,
the lowest metal wiring layer is arranged on the contact plug, and
the second interlayer insulating film is arranged on the local interconnect, the lowest metal wiring layer and the first interlayer insulating film.

8. The solid-state imaging apparatus according to claim 1, further comprising:
an element isolation region configured to isolate the first photoelectric conversion element, wherein the local interconnect is extended above the element isolation region.

* * * * *